United States Patent

Mita et al.

[11] 3,932,881
[45] Jan. 13, 1976

[54] ELECTROLUMINESCENT DEVICE INCLUDING DICHROIC AND INFRARED REFLECTING COMPONENTS

[75] Inventors: Yoh Mita; Eiji Nagasawa, both of Tokyo, Japan

[73] Assignee: Nippon Electric Co., Inc., Tokyo, Japan

[22] Filed: Mar. 7, 1975

[21] Appl. No.: 556,446

Related U.S. Application Data

[63] Continuation of Ser. No. 393,490, Aug. 31, 1973, abandoned.

[30] Foreign Application Priority Data

Sept. 5, 1972  Japan .............................. 47-89333
Nov. 21, 1972  Japan ............................. 47-117437

[52] U.S. Cl. ...................... 357/17; 357/74; 357/18; 350/1
[51] Int. Cl.² .......................................... H01L 33/00
[58] Field of Search ............ 313/108, 109.5; 357/74, 357/75, 17, 18, 19; 350/1

[56] References Cited
UNITED STATES PATENTS

| | | | |
|---|---|---|---|
| 2,758,261 | 8/1956 | Armstrong et al. .................... | 357/72 |
| 3,281,606 | 10/1966 | Lueck .................................. | 357/17 |
| 3,300,646 | 1/1967 | Casebeer ............................. | 357/17 |
| 3,510,732 | 5/1970 | Amans ................................. | 357/17 |
| 3,529,200 | 9/1970 | Potter et al. ........................ | 357/18 |
| 3,593,055 | 7/1971 | Geusic ................................. | 357/17 |
| 3,676,668 | 7/1972 | Collins et al. ...................... | 357/17 |
| 3,711,700 | 1/1973 | Westlund et al. ................... | 350/1 |
| 3,769,503 | 10/1973 | Kim ..................................... | 350/1 |
| 3,821,775 | 6/1974 | Baird .................................. | 357/17 |

*Primary Examiner*—Andrew J. James
*Attorney, Agent, or Firm*—John M. Calimafde; Robert A. Schroeder

[57] ABSTRACT

A light source having an infrared-emitting diode and a luminescent material excitable in a step-like manner for converting the infrared radiation to visible rays comprises an optical cavity enclosing the luminescent material. A portion of the cavity wall is a dichroic filter that is substantially transparent to the visible rays but reflects the infrared radiation. The other cavity wall reflect the infrared radiation in particular.

4 Claims, 4 Drawing Figures

ELECTROLUMINESCENT DEVICE INCLUDING DICHROIC AND INFRARED REFLECTING COMPONENTS

This is a continuation of application Ser. 393,490 filed Aug. 31, 1973, now abandoned.

BACKGROUND OF THE INVENTION

This invention relates to a solid-state light-emitting or electroluminescent device for converting electrical energy to the energy of visible rays.

Various solid-state devices of the type described are coming into use as pilot lamps and in particular as solid-state number and/or letter display panels because of their compactness, high reliability, and moderate cost. Among such known sold-state electroluminescent devices, are semiconductor junction diodes that generally produce red radiation. Although a semiconductor junction diode of a crystal of gallium phosphide including nitrogen impurity is capable of producing green rays to which human eyes are more sensitive compared to red rays, it is difficult to grow these crystals because the high volatility of the phosphor requires a high ambient pressure that balances the high vapor pressure of the phosphor while growing the crystal. In addition, the efficiency of conversion of the electrical energy to visible-ray energy is at most 2 percent with a junction diode for red rays and only 0.1 percent with one for green rays. Among solid-state electroluminescent devices of the type described, a combination of an infrared-emitting electroluminescent diode and a luminescent material excitable in a step-like manner is also known which produces red, green, blue, or other rays in accordance with the choice of the luminescent material. The efficiency of conversion is, howver, only 0.2 percent at most with a combination for red rays, 0.02 percent with a combination for green rays, and even lower with a combination for blue rays in the normal mode of operation.

SUMMARY OF THE INVENTION

It is therefore an object of the present invention to provide a light-emitting or electroluminescent device comprising an infrared-emitting electroluminescent diode and a luminescent material excitable in a step-like manner and operable with an excellent efficiency of conversion of electrical energy to the energy of visible rays.

It is another object of this invention to provide a light-emitting device of the type described, capable of producing visible rays of the desired color.

It is still another object of this invention to provide a light-emitting device of the type described, that is easy to manufacture and consequently of moderate cost.

In the manner known in the art, a light-emitting device according to this invention comprises an infrared-emitting electroluminescent diode, such as a silicon-doped gallium arsenide diode, and a luminescent material excitable in a step-like manner for converting the infrared radiation to the visible rays, such as a rare-earth fluoride luminescent material activated by erbium ions and sensitized by ytterbium ions. In accordance with this invention, the device further comprises an optical cavity enclosing the luminescent material. A portion of the cavity wall through which the visible rays are emitted is formed by dichroic filter means that is substantially transparent to the visible rays and reflects the infrared radiation. A portion of the cavity wall through which the visible rays need not be emitted may be formed by a reflector means capable of reflecting the infrared radiation.

According to an aspect of this invention, the luminescent material is in the powder state and placed within the cavity together with the infrared-emitting diode and in contact therewith.

According to another aspect of this invention, the luminescent material is a single crystal attached to the infrared-emitting diode by a bonding and refractive-index matching glass layer and covered by the walls of the cavity.

BRIEF DESCRIPTION OF THE DRAWINGS

For a more detailed understanding of the invention, reference may be made to the description below taken in conjunction with the accompanying drawings wherein.

DESCRIPTION OF THE PREFERRED EMBODIMENTS

Figure 1:
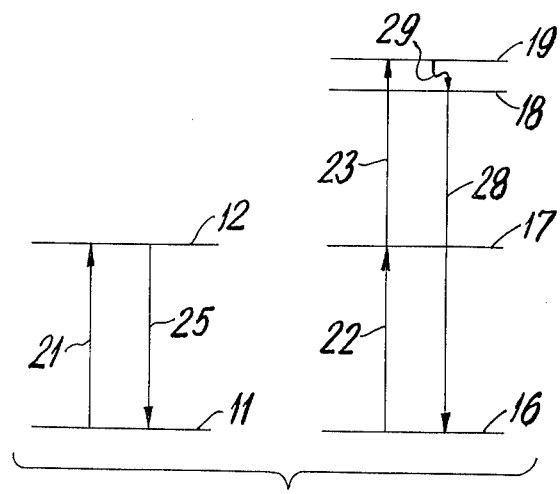
FIG. 1 schematcially shows the energy levels of an luminescent material excitable in a step-like manner used in a device according to the instant invention.
Figure 2:
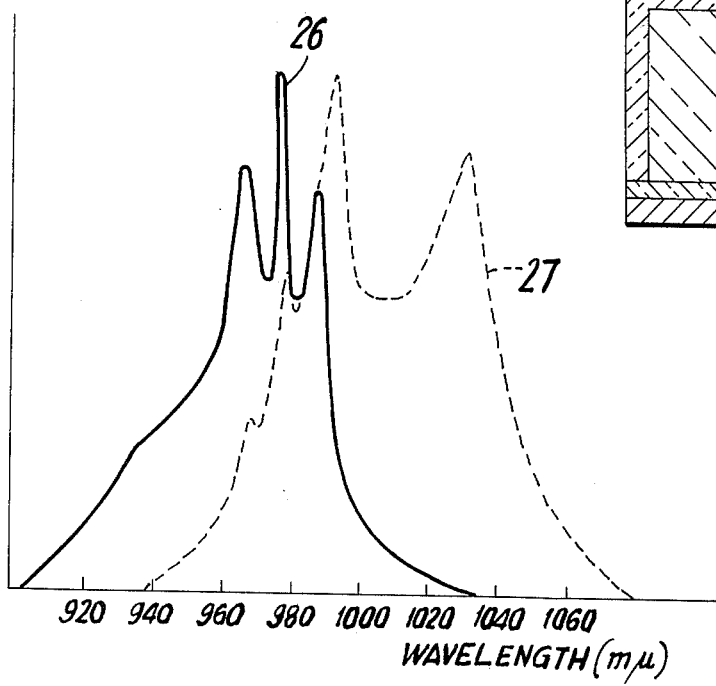
FIG. 2 shows the excitation and the emission spectra of a sensitizer used in the luminescent material.

Before describing the specific preferred embodiments of the present invention, the operation of a light-emitting device comprising an infrared-emitting electroluminescent diode and a luminescent material excitable in a step-like manner for converting the infrared radiation to visible rays will be analysed with reference to FIGS. 1 and 2 in order to facilitate an understanding of this invention. The diode may be a silicon-doped gallium arsenide diode for emitting infrared radiation centered at about 0.96 microns. The luminescent material may be a rare-earth fluoride luminescent material sensitized by ytterbium ions having relative energy levels are shown by lines 11 and 12 and activated by erbium ions having relative energy levels are shown by lines 16, 17, 18, and 19. The energy difference between the levels 11 and 12 corresponds to a wavelength of about 0.97 microns that falls in the infrared region. The energy difference between the levels 16 and 17 or between the levels 17 and 19 also correspond to a wavelength of about 0.97 microns. The energy difference between the levels 16 and 18 corresponds to a wavelength of about 0.54 microns that provides green stimulation to human eyes. A portion of the infrared radiation emitted by the electroluminescent diode is absorbed by the ytterbium ions as indicated by arrow 21. A portion of the absorbed energy is transferred to the erbium ions as indicated by arrows 22 and 23 to excite the erbium ions in a step-like manner from the ground state 16 to the intermediate energy level 17 and then to the second excited level 19. The majority of the energy absorbed by the ytterbium ions is not directly transferred to the erbium ions but emitted as light as illustrated by line 25. The excitation spectrum 26 of ytterbium ions overlaps the emission spectrum 27 thereof over a considerable range of wavelengths. A portion of the energy emitted by the ytterbium ions returning to the ground state 11 is therefore repeatedly absorbed by the ytterbium ions to be eventually utilized to excitation of the erbium ions. The erbium ions emit green rays upon occurrence of a downward transition (arrow 28) from the relatively higher energy level 18 to the ground state 16 after a decay (arrow 29) of the energy from the second excited level 19 to the relatively higher energy level 18 without emission of radiation. The erbium ions alternatively emit red rays. Inasmuch as the energy transfer from the ytterbium ions to the erbium ions takes place in two steps 22 and 23, the intensity of the visible rays emitted by the luminescent material varies approximately quadratically with the concentration of the excited ytterbium ions and consequently with the intensity of excitation and the lifetime of the excited ytterbium ions. Thus the efficiency of conversion of the luminescent material for the infrared radiation is substantially proportional to the infrared energy incident on a unit area of the luminescent material.

Conventional light-emitting device of the type described make use of powdered luminescent materials having a particle size of about ten microns. Scattering of light is therefore considerable, particularly at the surface of a mass of the luminescent material. When the luminescent material is deposited on the surface of the electroluminescent diode in a thick layer, most of the green rays emitted by the luminescent material located adjacent to the diode surface are lost before reaching the exposed surface of the luminescent material. When the luminescent material layer is thin, it is impossible to fully utilize the infrared radiation emitted by the electroluminescent diode. Although the layer thickness is set at an optimum value to render the maximum visible-ray output, about 70 percent of the infrared energy emitted by the diode is lost without being converted to the visible-ray energy. In addition, an appreciable proportion of the infrared radiation emitted by the ytterbium ions is also lost without being utilized to excite the erbium ions. It has thus been confirmed that the low conversion efficiency of a light-emitting device of the type described is attributed to the considerable loss of the exciting infrared energy. The basic concept of this invention is therefore to trap the exciting infrared radiation within an optical cavity and utilize the radiation to the fullest extent. It has also been confirmed that the lifetime of the excited ytterbium ions is thereby lengthened.

The lifetime of the excited ytterbium ions in a powdered luminescent material is shorter than that of the similar ions in a single crystal luminescent material, being at the longest shorter than two milliseconds in a powdered yttrium fluoride luminescent material activated by erbium ions and sensitized by ytterbium ions. In addition, the scattering of the light fails to give a clearly defined luminous area. A single crystal luminescent material is therefore resorted to according to one aspect of this invention.

Figure 3:
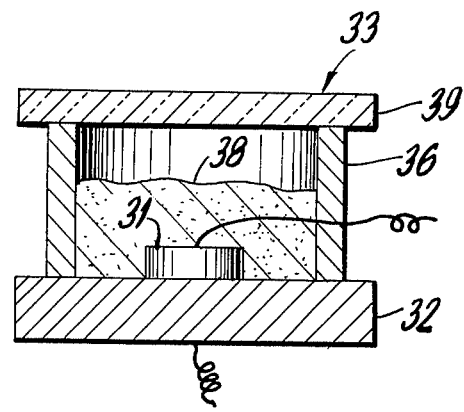
FIG. 3 is a schematic vertical sectional view of a first embodiment of this invention.

Referring now to FIG. 3, a light-emitting device according to a first embodiment of this invention comprises a silicon-doped gallium arsenide diode 31 mounted on a substrate 32 that serves also as one of the electrodes for supplying the diode current to excite the diode 31 as well as one of the walls of a housing or optical cavity 33 of the electroluminescent device. The cavity 33 is partially defined by a side wall 36 made of a material that reflects at least a substantial portion of the infrared radiation. A mass 38 of yttrium fluoride luminescent material activated by erbium ions and sensitized by ytterbium ions and an approximately equal amount of a binding agent having substantially the same refractive index as the luminescent material, such as epoxy resin, is placed within the cavity 33 and in contact with the diode 31. The cavity 33 is closed by a dichroic filter 39. The inside surfaces of the substrate 32 and the side wall 36 are preferably rendered optical flat and plated with gold or aluminium. It is possible to make the dichroic filter 39 reflect substantially all of the infrared radiation incident perpendicularly thereon and transmit about 80 percent of the green rays emitted by luminescent material. The cavity 33 may be 1.5 millimeter in diameter and 0.7 millimeter high.

With light-emitting devices according to the first embodiment, it has been found possible to raise the conversion efficiency to 0.1 percent and the surface brightness to 3,000 footlamberts. It will be appreciated that these values are comparable to those attained by a gallium phosphide junction diode for green rays. The lifetime of the excited ytterbium ions is lengthened from the previously attainable value of 2.0 milliseconds to 3.5 milliseconds. It is, however, to be noted that the maximum possible thickness of the luminescent material mass 38 is about 1 millimeter with the luminescent material and the binding agent now available.

Figure 4:
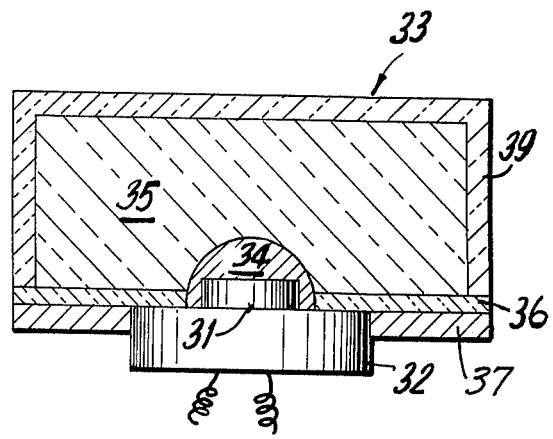
FIG. 4 is a similar view of a second embodiment of this invention.

Referring to FIG. 4, a light-emitting device according to a second embodiment of this invention comprises a silicon-doped gallium arsenide diode 31 mounted on a substrate 32 that serves also as a portion of a housing or optical cavity 33 of the light-emitting device. A mass 34 of glass of high refactive index and low melting point is applied to the diode 31. A single crystal 35 of a luminescent material is attached to the glass mass 34 to embed the diode 31. The luminescent material single crystal 35 may be a mixed crystal of berium fluoride and yttrium fluoride that has a composition of $BaY_{1-3}Yb_{0.65}E_{0.05}F_8$. The bottom surface of the single crystal 35 is covered with a film 36, such as a quarter-wavelength film, for reflecting the infrared radiation except the portion covered with the substrate 32. The film 36 is further covered with a thin metal film 37 vaporized or otherwise attached thereto to reflect the green rays. The remaining surfaces of the single crystal 35 are covered with dichroic filter means 39. The glass may have a high refractive index, such as 2.2, and the external surface of the mass 34 is preferably hemispherical. A somewhat shorter wavelength should be selected for the quarter-wavelength film 36 to make the film 36 reflect the infrared radiation acutely incident thereon. The metal of the thin metal film 37 is preferably silver.

With barium yttrium fluoride $BaY_2F_8$ (ytterbium and/or erbium being substituted for a portion of yttrium), it is easy to grow a large single crystal and to achieve a relatively long lifetime of the excited ytterbium ions. It is possible to render the lifetime as long as four milliseconds with the material described purified with care and grown into a single crystal as perfectly as possible.

While a few preferred embodiments of this invention have thus far been described, it will be understood that it is possible to carry this invention into effect in various other forms. For example, the side surfaces of the single crystal 35 may be either covered with infrared reflecting walls instead of the dichroic filter means 39 or dispensed with any wall of the so-called optical cavity. For yellow rays, use may be made of a luminescent material $BaYb_2F_3:Er$ and a quarter-wavelength film 36 of a similar construction. For red rays, the luminescent material may be $Y_{1.75}Yb_{0.20}Er_{0.05}O_3$. The infrared radiation reflecting wall means 36 or 36 and 37 for use in this case should reflect also the infrared radiation that is emitted by the luminescent material ranging from 1.5 microns to 1.6 microns. For blue rays, the luminescent material may be $BaY_{1.1}Yb_{0.89}Tm_{0.01}F_8$ that emits also radiation of the wavelengths 1.7 microns and 0.84 microns. The infrared radiation reflecting wall means 36 or 36 and 37 therefor should preferably reflect the infrared radiation of these wavelengths.

Other variations and modifications of the invention will occur to those skilled in the art. The above-described embodiments are exemplary and do not limit the scope of the invention.

What is claimed is:

1. A light emitting device comprising:
   diode means for emitting first infrared radiation;
   a single crystal of luminescent material excitable in a step-like manner by said infrared radiation attached to said diode means for emitting visible radiation together with second infrared radiation having a wavelength range in common with said first infrared radiation, said luminescent material being sensitized by ytterbium ions; and
   a closed optical cavity comprising, in turn, a dichroic filter disposed in front of said diode means that is transparent to said visible radiation but reflects said first and second infrared radiation and a reflector that extends behind said diode means as a back wall of the cavity and reflects said first and second infrared radiation, said cavity thereby confining said first and second infrared radiation therein and emitting only said visible radiation through said dichroic filter, whereby the excited state lifetime of said ytterbium ions is made as long as about four milliseconds.

2. A light emitting device comprising a cavity in which the crystal is enclosed formed entirely by a reflector that extends about the periphery of the diode means to form a back wall of the cavity and by a dichroic filter transparent to visible radiation but reflecting infrared radiation, diode means for emitting infrared radiation, a single crystal of luminescent material excitable in a step-like manner attached to the diode means for converting infrared radiation from the diode means and radiation reflected by the reflector and the filter into visible radiation, whereby infrared radiation is substantially confined within the cavity and only visible radiation is emitted from the cavity.

3. The light emitting device of claim 1, wherein the reflector and the dichroic filter completely enclose the diode means and the crystal.

4. The light emitting device of claim 1, wherein the cavity is completely filled by the diode means and the crystal.

* * * * *

UNITED STATES PATENT OFFICE
CERTIFICATE OF CORRECTION

Patent No. 3,932,881    Dated January 13, 1976

Inventor(s) Yoh Mita and Eiji Nagasawa

It is certified that error appears in the above-identified patent and that said Letters Patent are hereby corrected as shown below:

The assignee of the patent is:

--Nippon Electric Company, Limited--.

Signed and Sealed this

Twenty-eighth Day of September 1976

[SEAL]

Attest:

RUTH C. MASON
Attesting Officer

C. MARSHALL DANN
Commissioner of Patents and Trademarks